United States Patent
Kang et al.

(10) Patent No.: US 11,789,305 B2
(45) Date of Patent: Oct. 17, 2023

(54) SUBSTRATE, DISPLAY PANEL, AND SUBSTRATE MANUFACTURING METHOD

(71) Applicant: SEMES CO., LTD., Cheonan-si (KR)

(72) Inventors: Han Lim Kang, Seoul (KR); Yoon Ok Jang, Cheonan-si (KR); Jun Seok Lee, Cheonan-si (KR); Hyun Min Lee, Geochang-gun (KR)

(73) Assignee: SEMES CO., LTD., Cheonan-si (KR)

( * ) Notice: Subject to any disclaimer, the term of this patent is extended or adjusted under 35 U.S.C. 154(b) by 79 days.

(21) Appl. No.: 16/924,088

(22) Filed: Jul. 8, 2020

(65) Prior Publication Data

US 2021/0011328 A1    Jan. 14, 2021

(30) Foreign Application Priority Data

Jul. 10, 2019    (KR) .................. 10-2019-0083203

(51) Int. Cl.
*G02F 1/1335*    (2006.01)
*G02B 5/22*    (2006.01)
*G02F 1/1333*    (2006.01)
*G03F 7/20*    (2006.01)

(52) U.S. Cl.
CPC ........ *G02F 1/133516* (2013.01); *G02B 5/223* (2013.01); *G02F 1/133377* (2013.01); *G02F 1/133512* (2013.01); *G03F 7/202* (2013.01); *G03F 7/2018* (2013.01)

(58) Field of Classification Search
CPC ......... G02F 1/133514; G02F 1/133516; G02F 1/13396; G02B 5/22; G02B 5/223
See application file for complete search history.

(56) References Cited

U.S. PATENT DOCUMENTS

| | | | |
|---|---|---|---|
| 7,501,754 B2 | 3/2009 | Funamoto et al. | |
| 7,547,567 B2* | 6/2009 | Moriya | H01L 27/3246 257/E21.174 |
| 2006/0008713 A1* | 1/2006 | Toyoda | G02B 5/223 430/7 |
| 2010/0141875 A1* | 6/2010 | Shim | G02F 1/133516 349/187 |
| 2018/0314097 A1* | 11/2018 | Kiyota | G02F 1/13394 |

FOREIGN PATENT DOCUMENTS

| | | |
|---|---|---|
| CN | 1662112 | 8/2005 |
| KR | 10-2006-0049182 A | 5/2006 |
| KR | 10-0647701 B1 | 11/2006 |
| KR | 10-2015-0081531 A | 7/2015 |

OTHER PUBLICATIONS

Office Action from the China National Intellectual Property Administration dated May 29, 2023.

* cited by examiner

*Primary Examiner* — Angela K Davison

(57) ABSTRACT

A substrate, a display panel, and a substrate manufacturing method are proposed. The substrate includes a base layer; partitioning walls located on the base layer and dividing the base layer into a plurality of pixel regions, and patterns located in each of the pixel regions of the base layer, and guiding spread of a liquid drop discharged to the base layer.

7 Claims, 6 Drawing Sheets

SUBSTRATE, DISPLAY PANEL, AND SUBSTRATE MANUFACTURING METHOD

CROSS REFERENCE TO RELATED APPLICATION

The present application claims priority to Korean Patent Application No. 10-2019-0083203, filed Jul. 10, 2019, the entire contents of which is incorporated by reference herein for all purposes.

BACKGROUND OF THE INVENTION

Field of the Invention

The present invention generally relates to a substrate, a display panel, and a substrate manufacturing method. More particularly, the present invention relates to a substrate, a display panel, and a substrate manufacturing method which can be used to manufacture display panels.

Description of the Related Art

Generally, to manufacture an electronic circuit component or a flat panel display such as a liquid crystal display panel, electrodes or uniform patterns such as dots are required to be formed on a glass surface or a printed circuit board (PCB) by using photoresist (PR) solution or metal pastes such as copper (Cu), silver (Ag), and aluminum (Al), etc.

As the method of forming a uniform pattern on a substrate, a method of directly patterning a uniform pattern in an offset printing method by using two rolls, or a method of discharging an ink drop may be used. Here, a liquid drop discharge apparatus for discharging the ink drop to the substrate is similar to a normal inkjet printer, and uses the method of directly patterning a uniform pattern on the substrate by using a nozzle.

Meanwhile, when an inkjet head included in a liquid drop discharge apparatus discharges a liquid drop to the substrate, the minimum volume of the liquid drop to fill each of pixels (i.e., pixel regions) of the substrate is predetermined. Hereinafter, unless otherwise described, the pixels refer to pixel regions in which displaying elements such as organic light-emitting diodes or quantum dots. In general, the correct amount of the liquid drop to be discharged is calculated and each of the pixels is filled with the liquid drop. However, liquid drops may not be normally filled in each pixel depending on the hydrophilic or hydrophobic property of the surface of the substrate.

In more detail, the inside of the pixel is required to be in a hydrophilic state so that liquid drops can spread evenly on the pixel. However, due to the hydrophobic property of the substrate, it may be difficult to spread liquid drops uniformly. Accordingly, even if the amount of the liquid drops to be filled in the pixel is discharged from the inkjet head, an area in which the liquid drops are not filled may exist.

When plasma treatment is performed to ensure that liquid drops are uniformly filled in the pixel, the liquid drops may overflow to the outside due to the high surface energies of the liquid drops and the hydrophilic properties of partitioning walls. Each of the partitioning walls is required to be kept hydrophobic so that even if ink is discharged to an area adjacent to the partitioning wall, the ink is injected into the pixel. The existing process method cannot allow an area inside the pixel and an area of the partitioning wall to selectively maintain hydrophilicity and hydrophobicity.

DOCUMENT OF RELATED ART (Patent Document 1) Korean Patent No. 10-0647701

SUMMARY OF THE INVENTION

Accordingly, the present invention has been made keeping in mind the above problems occurring in the related art, and the present invention is intended to propose a substrate, a display panel, and a substrate manufacturing method, wherein the spreadability of a liquid drop is improved.

In order to achieve the above objective, according to one aspect of the present invention, there is provided a substrate including: a base layer; partitioning walls located on the base layer and dividing the base layer into a plurality of pixel regions; and patterns located in each of the pixel regions of the base layer, and guiding spread of a liquid drop discharged to the base layer.

Meanwhile, each of the patterns may be configured in a linear shape.

Meanwhile, shapes of upper and lower sections of the patterns may be configured to be repeatedly and alternately located grooves and ridges.

Meanwhile, the liquid drop discharged to the pixel regions may be moved along the patterns, and is uniformly applied to the pixel regions.

Meanwhile, each of the patterns may be formed by lithography, imprinting, inkjet printing, roll printing, or etching using lasers and chemicals.

The display panel according to the aspect of the present invention may be manufactured by including the substrate described above.

The substrate manufacturing method according to the aspect of the present invention may include: arranging the base layer to provide the base layer; forming the patterns on the base layer; forming the partitioning walls on the base layer; and discharging the liquid drop to the base layer.

Meanwhile, in the forming each of the patterns, the pattern may be formed by the lithography, the imprinting, the inkjet printing, the roll printing, or the etching using lasers and chemicals.

Meanwhile, in the discharging of the liquid drop, the discharged liquid drop may be moved along the patterns, and may be uniformly applied to the pixel regions.

The substrate according to the present invention includes the pattern formed on the base layer. Accordingly, when the liquid drop is discharged to the base layer, an adhesive force between the substrate on which the pattern is famed and the liquid drop is relatively greater than the cohesive force of the liquid drop, so the liquid drop spreads according to the shape of the pattern. Accordingly, the liquid drop discharged to the pixel is moved along the pattern, and can be uniformly applied to the pixel. That is, the substrate according to the present invention can have significantly improved spreadability of a liquid drop compared to a substrate which does not include patterns.

Accordingly, in the substrate according to the present invention, the spreadability of a liquid drop can be improved just by forming the pattern on the base layer even without performing the adjustment of the viscosity or surface energy of the liquid drop, or a post-treatment process such as emitting ultraviolet rays or applying plasma treatment to the pixel.

In a conventional substrate, patterns are not located on the base layer, so light emitted from a back light unit included in a normal display panel is reflected, which may decrease light extraction efficiency. However, the substrate according to the present invention can scatter light emitted from the back light unit according to the shape of the pattern, thereby increasing the extraction efficiency of the light emitted to the outside.

In addition, even without the consideration of the complex elements of a substrate and a liquid drop, the substrate manufacturing method according to the present invention can manufacture a high quality and high resolution display module at a lower cost compared to a conventional substrate manufacturing method as long as the forming of the pattern on the base layer is performed.

BRIEF DESCRIPTION OF THE DRAWINGS

The above and other objects, features, and other advantages of the present invention will be more clearly understood from the following detailed description when taken in conjunction with the accompanying drawings, in which.

DETAILED DESCRIPTION OF THE INVENTION

Figure 1:
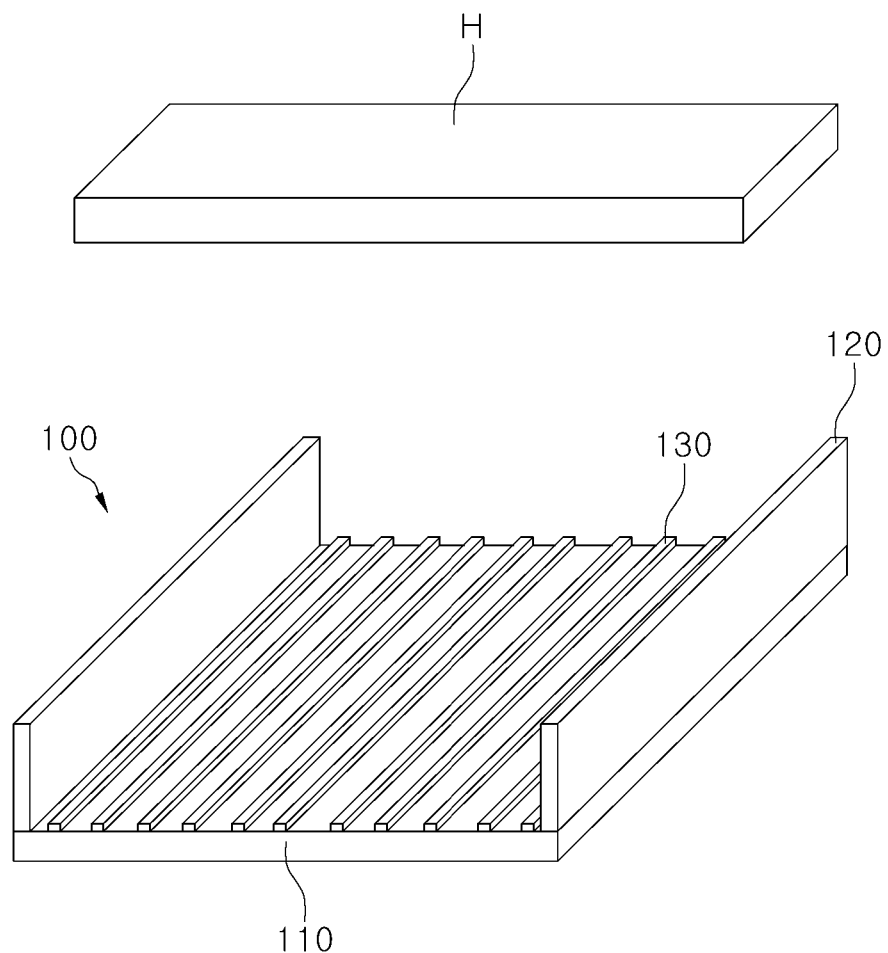
FIG. 1 is a perspective view illustrating a substrate and an inkjet head according to an embodiment of the present invention.

Hereinafter, an exemplary embodiment of the present invention will be described in detail with reference to the accompanying drawings so that those skilled in the art to which the present invention pertains can easily practice. The present invention can be implemented in many different forms and is not limited to the embodiment described herein.

In order to clearly describe the present invention, parts irrelevant to the description are omitted, and the same reference numerals are assigned to the same or similar elements throughout the specification.

In addition, in the embodiment, components having the same configuration will be described with the same reference numerals.

Throughout the specification, when a part is said to be "connected" to another part, this includes not only the case of being "directly connected", but also "indirectly connected" with other members interposed therebetween. Furthermore, when a part is said to "include" a certain component, this means that other components may be further included rather than excluding other components, unless otherwise stated.

Unless defined otherwise, all terms used herein, including technical or scientific terms, have the same meaning as commonly understood by a person skilled in the art to which the present invention pertains. Terms such as those defined in a commonly used dictionary should be interpreted as having meanings consistent with meanings in the context of related technologies, and should not be interpreted as ideal or excessively formal meanings unless explicitly defined in the present application.

Figure 2:
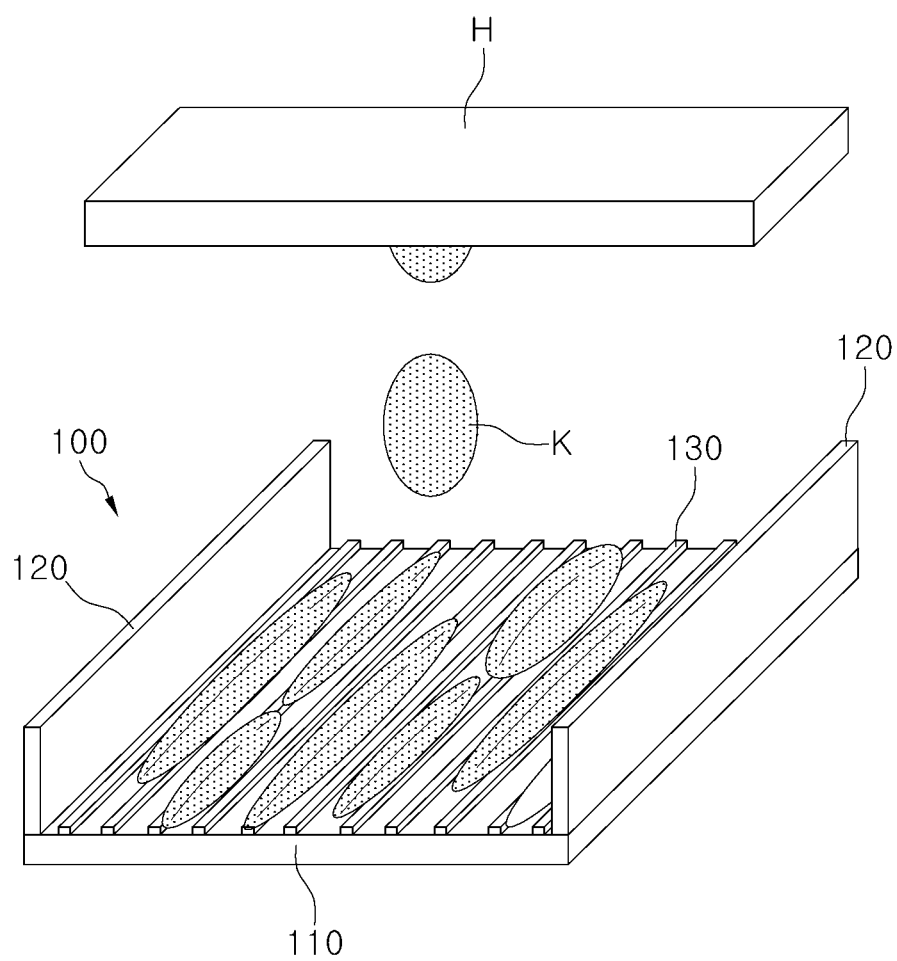
FIG. 2 is a view illustrating a state in which a liquid drop is discharged to the substrate of FIG. 1.

Referring to FIGS. 1 and 2, a substrate 100 according to the embodiment of the present invention includes a base layer 110, partitioning walls 120 and patterns 130.

The base layer 110 may be a base of the substrate. Such a base layer 110 may be, for example, glass. Alternatively, when the substrate 100 is used for manufacturing a flexible display panel, the base layer 110 may be a transparent film.

Each of the partitioning walls 120 may be located on the base layer 110 and divide the base layer 110 into a plurality of pixels. As described above, unless otherwise described, the pixels refer to pixel regions in which displaying elements such as organic lighting emitting diodes or quantum dots. Meanwhile, three neighboring pixels as a set may constitute one pixel, and may display various colors. The colors of the three pixels may be red, green, and blue, respectively. In such combination of the pixels, a white color may be added to the set according to the design of the flat panel display, but the combination is not limited to a specific combination.

The partitioning wall 120 defines space filled with a liquid drop K. The thickness and height of such a partitioning wall 120 may be changed according to the design of the substrate 100, and is not limited to a specific value. The partitioning wall 120 is made of a non-polar organic material or an inorganic material, so that the application of the liquid drop K can proceed efficiently.

Since such a partitioning wall 120 and the base layer 110 may be included in a normal substrate, detailed description thereof will be omitted.

The patterns 130 are located in each of the pixels of the base layer 110, and can guide the spread of the liquid drop K discharged to the base layer 110. Each of the patterns 130 may be configured in a linear shape.

Shapes of upper and lower sections of the patterns 130 may be configured to be repeatedly and alternately located grooves and ridges. The method of forming such a pattern 130 on the substrate 100 may be, for example, lithography, imprinting, inkjet printing, roll printing, or etching using lasers and chemicals.

For example, the method of forming the pattern 130 on the substrate 100 may be a method of patterning a material having a refractive index of less than 10% and a transparency of 90% or more to the glass on the base layer 110 by using a photolithography method. Alternatively, the method of forming the pattern 130 on the substrate 100 may also be a method of partially dissolving the base layer 110. The method of forming the pattern 130 on the substrate 100 is not limited only to the above-described method.

As illustrated in FIG. 2, when the liquid drop K is discharged between the partitioning walls 120 adjacent to each other from an inkjet head included in a normal inkjet printing system, the liquid drop K discharged to the pixel is moved along the pattern 130, and can be uniformly applied to the pixel.

The substrate 100 according to the embodiment of the present invention includes the pattern 130 located on the base layer 110. Accordingly, when the liquid drop K is discharged to the base layer 110, the adhesive force between the substrate 100 on which the pattern 130 is formed and the liquid drop K is relatively greater than the cohesive force of the liquid drop K, so the liquid drop K spreads according to the shape of the pattern 130. Accordingly, the liquid drop K discharged to the pixel is moved along the pattern 130, and can be uniformly applied to the pixel. That is, the substrate 100 according to the embodiment of the present invention can a significantly improved spreadability of the liquid drop K compared to the substrate 100 that does not include the pattern 130.

Accordingly, in the substrate 100 according to the embodiment of the present invention, the spreadability of the liquid drop K can be improved just by forming the pattern 130 on the base layer 110 even without performing the adjustment of the viscosity or surface energy of the liquid drop K, or a post-treatment process such as emitting ultraviolet rays or applying plasma treatment to the pixel.

Figure 3:
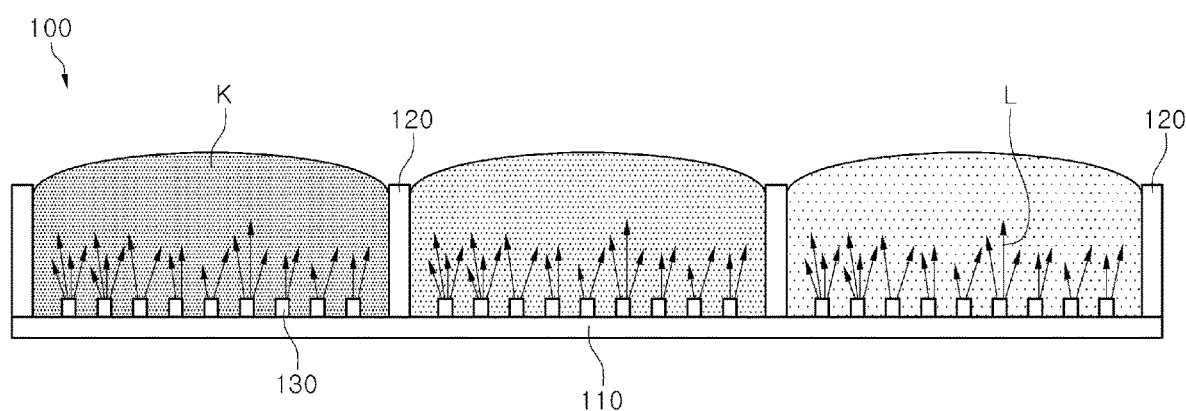
FIG. 3 is a view illustrating a state in which the liquid drop is filled in the substrate.

In a conventional substrate, patterns are not located on the base layer, so light emitted from a back light unit included in a normal display panel is reflected, which may decrease light extraction efficiency. However, as illustrated in FIG. 3, the substrate 100 according to the present invention can scatter light L emitted from the back light unit according to the shape and size of the pattern 130, thereby increasing the extraction efficiency of the light emitted to the outside.

Although not shown in the drawings, in a display panel according to the embodiment of the present invention including the substrate described above, the substrate, the glass, and a polarizing plate may be sequentially stacked. However, the display panel is not limited to such a configuration, and other things except the substrate may be changed according to the design of the display panel. For example, a touch sensor may be added to the display panel.

Hereinafter, a substrate manufacturing method of manufacturing the substrate 100 according to the embodiment of the present invention, which is described above, will be described with reference to the accompanying drawings.

Figure 4:
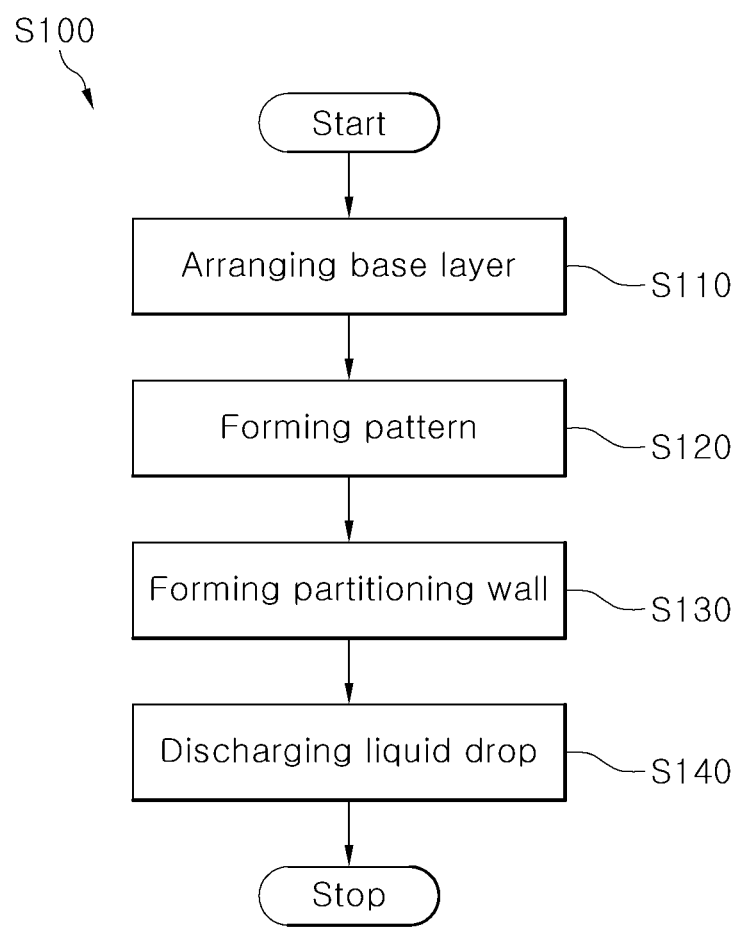
FIG. 4 is a flowchart illustrating a substrate manufacturing method according to the embodiment of the present invention.
Figure 5:
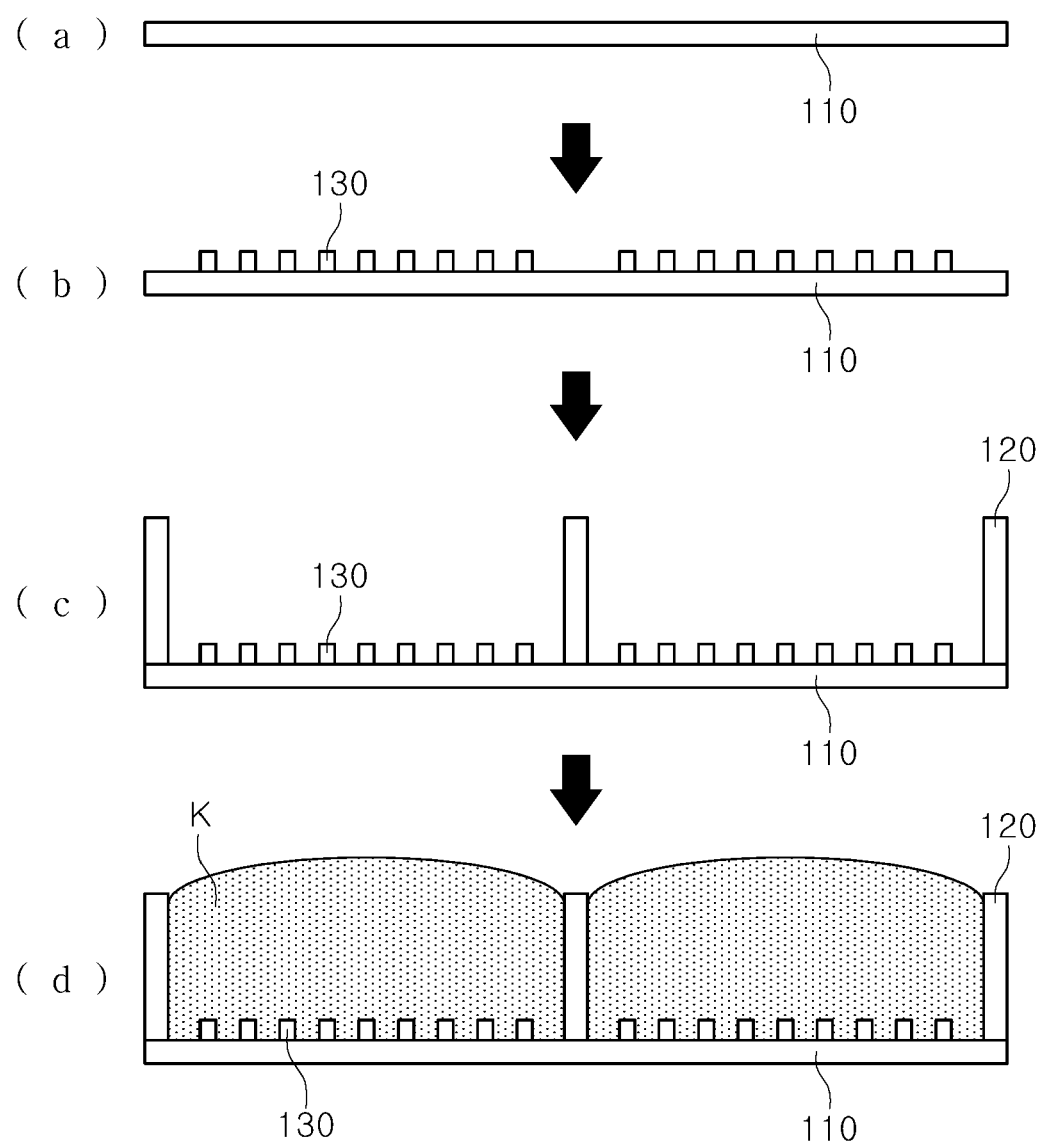
FIG. 5 illustrates a process in which the substrate is manufactured by the substrate manufacturing method of FIG. 4.

Referring to FIGS. 4 and 5, the substrate manufacturing method S100 according to the embodiment of the present invention includes arranging the base layer at S110, forming the patterns at S120, forming the partitioning walls at S130, and discharging the liquid drop at S140.

In the arranging of the base layer at S110, the base layer 110 may be provided (see sequence (a) of FIG. 5). Although not shown, the base layer 110 is moved by a moving unit, and may be located on a stage such as an electrostatic chuck inside a chamber included in a substrate processing device.

In the forming of the pattern at S120, the pattern 130 may be formed on the base layer 110 (see sequence (b) FIG. 5). In the forming of the pattern at S120, the pattern may be formed by using photolithography, imprinting, roll printing, or etching of using laser and chemicals. The overall shape of the pattern such as the interval and height of the pattern produced by such a forming of the pattern at S120 may be changed in various ways depending on the design thereof, so the overall shape is not limited to a specific shape.

Figure 6A:
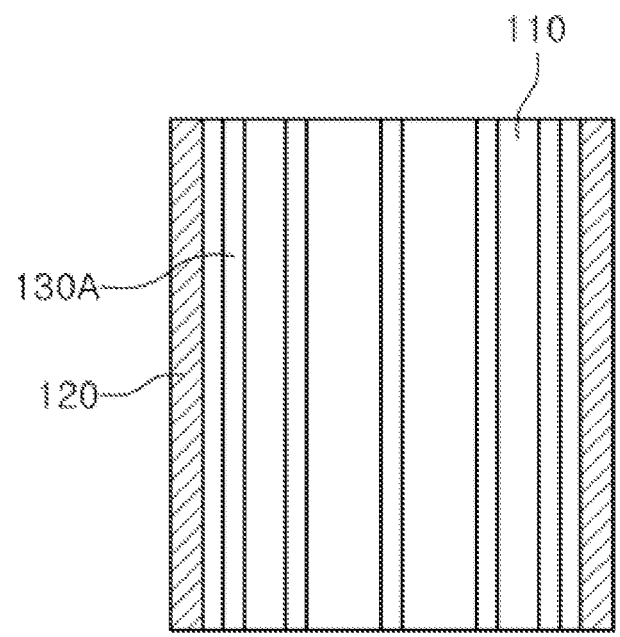
FIGS. 6A and 6B are views illustrating various shapes of patterns.
Figure 6B:
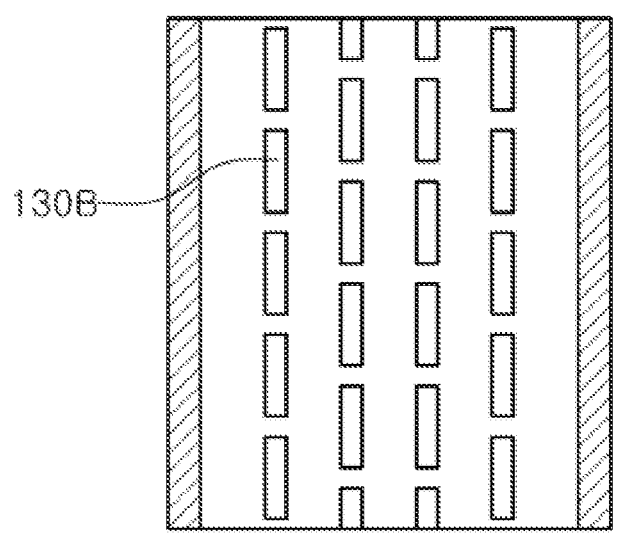

For example, as illustrated in FIG. 6A, the shape of the pattern 130A may be made to be somewhat denser in a portion adjacent to the partitioning wall than the center of the pixel. Alternately, the pattern 130B may be formed in the shape of a dotted line as illustrated in FIG. 6B.

In the forming of the partitioning walls at S130, the partitioning walls 120 may be provided on the base layer 110 (see sequence (c) of FIG. 5). The method of forming the partitioning walls 120 on the base layer 110 may be a known method used in a normal substrate manufacturing method, so detailed description thereof will be omitted.

In the discharging of the liquid drop at S140, the liquid drop K may be discharged to the base layer 110. The liquid drop K may be discharged between the partitioning walls 120 adjacent to each other from the inkjet head included in the normal inkjet printing system.

When the inkjet head is located above the base layer 110, the position alignment of the inkjet head is performed, and the inkjet head can discharge a predetermined amount of liquid drop to an exact targeted position in each pixel. As illustrated in sequence (d) of FIG. 5, in the discharging at S140, the discharged liquid drop K is moved along the pattern 130, and can be uniformly applied to the pixel.

Even without the consideration of the complex elements of the substrate 100 and the liquid drop K, such a substrate manufacturing method S100 according to the embodiment of the present invention can manufacture a high quality and high resolution display module at low cost compared to a conventional substrate manufacturing method as long as the forming of the pattern 130 on the base layer 110 at S120 is performed.

Although the embodiment of the present invention has been described above, the drawings referenced so far and the detailed description of the described invention are merely used for the purpose of illustrating the present invention, but are not used to limit meaning or the scope of the present invention described in the scope of claims. Therefore, those skilled in the art will appreciate that various modifications, additions and substitutions are possible, without departing from the scope and spirit of the invention as disclosed in the accompanying claims. Accordingly, the true technical protection scope of the present invention should be determined by the technical spirit of the appended claims.

What is claimed is:

1. A display panel comprising:
   a substrate comprising:
      a base layer;
      a plurality of partitioning walls located on the base layer and dividing the base layer into a plurality of pixel regions, wherein each pixel region of the plurality of pixel regions is defined by corresponding two adjacent partitioning walls of the plurality of partitioning walls; and
      a plurality of patterns located in each pixel region of the plurality of pixel regions of the base layer, wherein a height of each pattern of the plurality of patterns is lower than a height of each partitioning wall of the plurality of partitioning walls; and
   a liquid drop in each pixel region of the plurality of pixel regions,
   wherein the liquid drop in each pixel region contacts upper surfaces of the plurality of patterns,
   wherein each pattern of the plurality of patterns extends along a straight line extending in a first direction and the plurality of patterns are spaced apart from each other in a second direction, the second direction being different from the first direction, and
   wherein the plurality of patterns include neighboring patterns spaced apart from each other at a first spacing and another neighboring patterns spaced apart from each other at a second spacing different from the first spacing.

2. The display panel of claim 1,
   wherein each pattern of the plurality of patterns has a linear shape.

3. The display panel of claim 1,
   wherein the plurality of patterns are arranged repeatedly and alternately to form a plurality of grooves and a plurality of ridges, and
   wherein a height of each ridge of the plurality of ridges is lower than the height of each partitioning wall.

4. The display panel of claim 1,
   wherein the plurality of patterns in each pixel region are configured to cause the liquid drop discharged to each pixel region to move along each of the plurality of patterns.

5. The display panel of claim 1,
wherein each pattern of the plurality of patterns is formed by lithography, imprinting, inkjet printing, or roll printing.

6. The display panel of claim 1,
wherein each of the plurality of patterns is formed by etching using lasers and chemicals.

7. The display panel of claim 1,
wherein each pattern of the plurality of patterns extends along a straight line extending in a first direction and the plurality of patterns are spaced apart from each other in a second direction, the second direction being different from the first direction, and
wherein each pattern of the plurality of patterns includes a plurality of sub-patterns spaced apart from each other in the first direction and arranged along the straight line.

* * * * *